US012702065B2

(12) United States Patent
Gandhi et al.

(10) Patent No.: US 12,702,065 B2
(45) Date of Patent: Aug. 4, 2026

(54) CHIP PACKAGE INTEGRATION WITH HYBRID BONDED BRIDGE DIE

(71) Applicant: XILINX, INC., San Jose, CA (US)

(72) Inventors: Jaspreet Singh Gandhi, San Jose, CA (US); Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 610 days.

(21) Appl. No.: 18/081,461

(22) Filed: Dec. 14, 2022

(65) Prior Publication Data

US 2024/0203968 A1      Jun. 20, 2024

(51) Int. Cl.
| | |
|---|---|
| *H01L 25/18* | (2023.01) |
| *H10W 70/65* | (2026.01) |
| *H10W 90/00* | (2026.01) |
| *H10W 72/00* | (2026.01) |

(52) U.S. Cl.
CPC .......... *H10W 90/00* (2026.01); *H10W 70/65* (2026.01); *H10W 72/072* (2026.01); *H10W 90/724* (2026.01); *H10W 90/794* (2026.01)

(58) Field of Classification Search
None
See application file for complete search history.

(56) References Cited

U.S. PATENT DOCUMENTS

| | | | |
|---|---|---|---|
| 7,838,337 B2 * | 11/2010 | Marimuthu | ......... H01L 21/6835 257/E21.511 |
| 9,190,297 B2 | 11/2015 | Choi | |
| 9,418,966 B1 | 8/2016 | Kwon et al. | |
| 11,462,531 B2 * | 10/2022 | Yu | ....................... H01L 25/0657 |
| 2006/0226527 A1 | 10/2006 | Hatano et al. | |
| 2011/0285006 A1 | 11/2011 | Weng et al. | |
| 2013/0168854 A1 * | 7/2013 | Karikalan | ............... H01L 24/73 257/784 |
| 2014/0070380 A1 | 3/2014 | Chiu et al. | |
| 2014/0353827 A1 | 12/2014 | Liu | |
| 2023/0207475 A1 * | 6/2023 | Brun | ................... H01L 23/5386 257/666 |
| 2024/0120315 A1 * | 4/2024 | Chen | ................... H01L 23/3185 |

* cited by examiner

*Primary Examiner* — Long Pham
(74) *Attorney, Agent, or Firm* — Patterson + Sheridan, LLP

(57) ABSTRACT

A chip package and method for fabricating the same are provided that include hybrid bonded bridge dies connecting IC dies on adjacent die stacks. In one example, a chip package includes an interconnect routing structure, a first die stack and a second die stack. The first die stack includes a top die disposed over a bottom die, the bottom die stacked on the interconnect routing structure. The second die stack also includes a top die disposed over a bottom die, the bottom die stacked on the interconnect routing structure. The first bridge die is electrically and mechanically coupled to the top dies of the first and second die stacks. The first bridge die having solid state circuitry that connects circuitries of the top dies of the first and second die stacks.

28 Claims, 16 Drawing Sheets

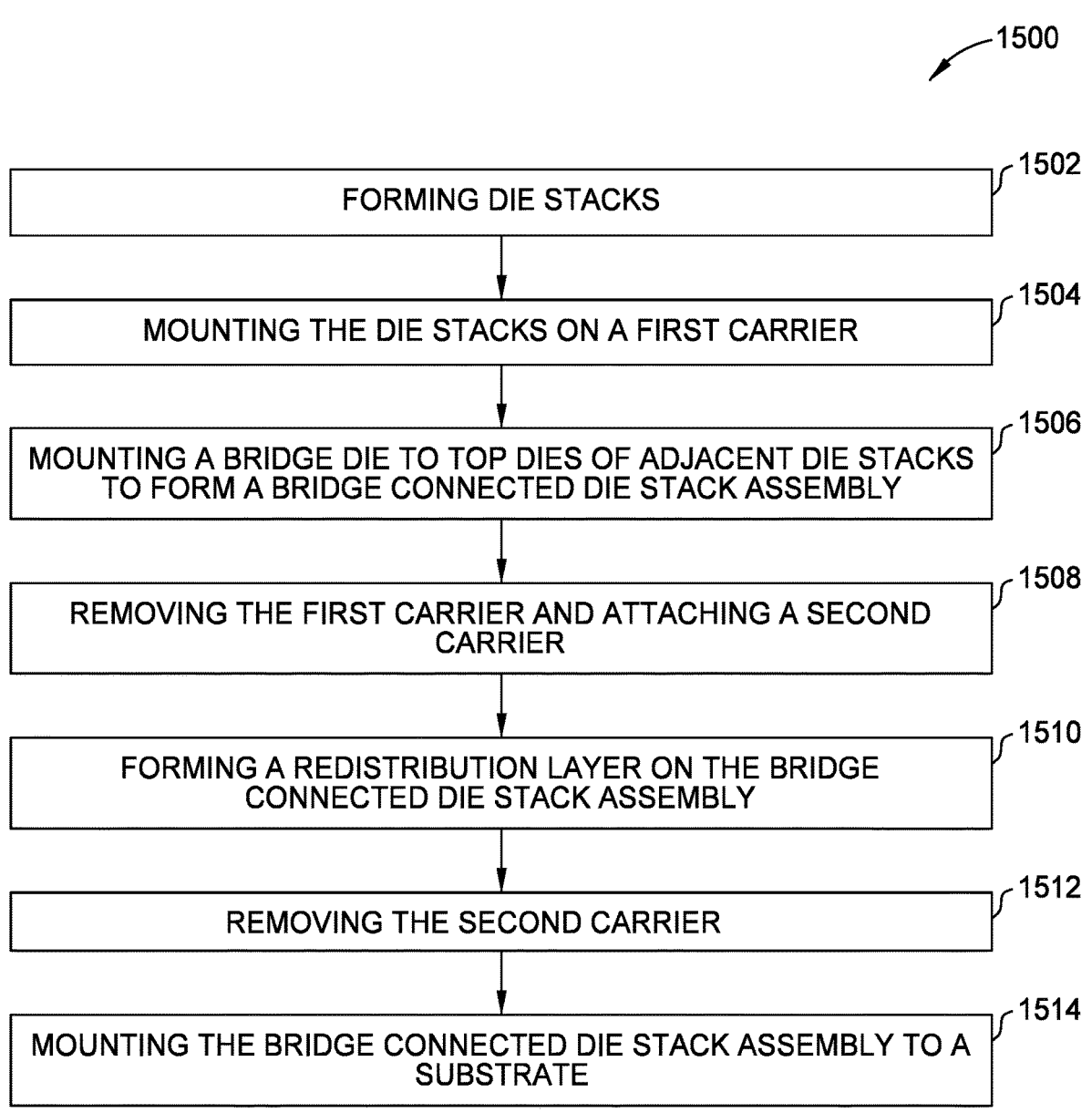

1500

1502
FORMING DIE STACKS

1504
MOUNTING THE DIE STACKS ON A FIRST CARRIER

1506
MOUNTING A BRIDGE DIE TO TOP DIES OF ADJACENT DIE STACKS TO FORM A BRIDGE CONNECTED DIE STACK ASSEMBLY

1508
REMOVING THE FIRST CARRIER AND ATTACHING A SECOND CARRIER

1510
FORMING A REDISTRIBUTION LAYER ON THE BRIDGE CONNECTED DIE STACK ASSEMBLY

1512
REMOVING THE SECOND CARRIER

1514
MOUNTING THE BRIDGE CONNECTED DIE STACK ASSEMBLY TO A SUBSTRATE

FIG. 15

CHIP PACKAGE INTEGRATION WITH HYBRID BONDED BRIDGE DIE

TECHNICAL FIELD

Embodiments of the present invention generally relate to a chip package having hybrid bonded bridge die, and in particular, to a chip package having die stacks that communicate directly via one or more bridge dies hybrid bonded to directly between dies of the die stack.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices.

In advanced chip-on-wafer (CoW) chip packages, the integration of stacks of IC dies is becoming increasingly challenging, particularly as fine pitch and high density interconnects at the IC die to substrate interface are highly desirable to obtain performance goals. In 3D devices, the amount of traces routed through the package substrate has become increasingly large, in some cases creating bandwidth limitations. To address bandwidth limitations, some designers have partitioned designs to space super logic regions within devices. However, since the microbump pitch connecting IC dies to the substrate is generally limited, longer routing distances are consequently required. The longer routing distances require thick metal traces within the package substrate, which in turn limits the number of traces per unit edge length and undesirably limits the total bandwidth.

Therefore, a need exists for a chip package having improved bandwidth.

SUMMARY

A chip package and method for fabricating the same are provided that include hybrid bonded bridge dies connecting IC dies on adjacent die stacks. In one example, a chip package includes an interconnect routing structure, a first die stack and a second die stack. The interconnect routing structure may be an interposer, package substrate, redistribution layer and the like. The first die stack includes a top die disposed over a bottom die, the bottom die stacked on the interconnect routing structure. The second die stack also includes a top die disposed over a bottom die, the bottom die stacked on the interconnect routing structure. The first bridge die is hybrid bonded to the top dies of the first and second die stacks. The first bridge die having solid state circuitry that connects circuitries of the top dies of the first and second die stacks.

In another example, a chip package is provided that includes an interconnect routing structure, a first die stack and a second die stack. The interconnect routing structure is one of a redistribution layer or a package substrate. The first die stack includes a top die disposed over a bottom die, the bottom die stacked on the interconnect routing structure. The circuitry of the bottom die of the first die stack is coupled to circuitry of the interconnect routing structure at a first connection density. The second die stack also includes a top die disposed over a bottom die, the bottom die stacked on the interconnect routing structure. The interconnect routing structure includes a bottom surface configured to receive a solder connection and a top surface. The first bridge die electrically and mechanically coupled to the top dies of the first and second die stacks. The first bridge die has solid state circuitry that connects circuitries of the top dies of the first and second die stacks at a second connection density that is greater than the first connection density.

In another example, a method for forming a chip package is provided that includes mounting first and second die stacks on a first carrier substrate; filing a gap defined between the first and second die stacks; mounting a first bridge die on top dies of the first and second die stacks disposed farthest from the first carrier substrate, the first bridge die electrically connecting the top dies of the first and second die stacks; mounting spacers on the first and second die stacks on opposite sides of the bridge die; mounting the spacers, the first die stack and the second die stack on a second carrier, at least one of the spacers comprising a memory die, a processor, a dummy die or a deep trench capacitor; removing the first carrier substrate from bottom surfaces of the first and second die stacks; forming pillars on the bottom surfaces dies of the first and second die stacks; electrically and mechanically mounting the pillars to an interconnect routing structure, the interconnect routing structure one of a redistribution layer or a package substrate; and removing the second carrier substrate from the first and second die stacks.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 15 is a flow diagram of another method for forming a chip package having a bridge die coupling adjacent die stacks.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that enable fine pitch and high density interconnects between IC dies on adjacent die stacks without being routed through an interconnect routing structure, such as an interposer, package substrate or redistribution layer. The high density interconnects between IC dies on adjacent die stacks are made through a hybrid bonded bridge die. The interface between the IC dies on the adjacent stacks and the bridge die leverages hybrid bonding techniques that enable formation of sub-micron fine pitches between interconnects. Since the hybrid bond pitch is in the 6-9 μm range, the use of a hybrid bonded bridge die enables more than 10 times the amount of connections per unit area as compared to microbump interfaces, and thus can significantly reduce the super logic region to super logic region connectivity bottlenecks in conventional 3D stacked devices. For example, a hybrid bonded bridge die allows more metal traces per unit area, allows shorter distances between connections, and thinner metal routings, all of which enable a significant increase in connection density.

Figure 1:
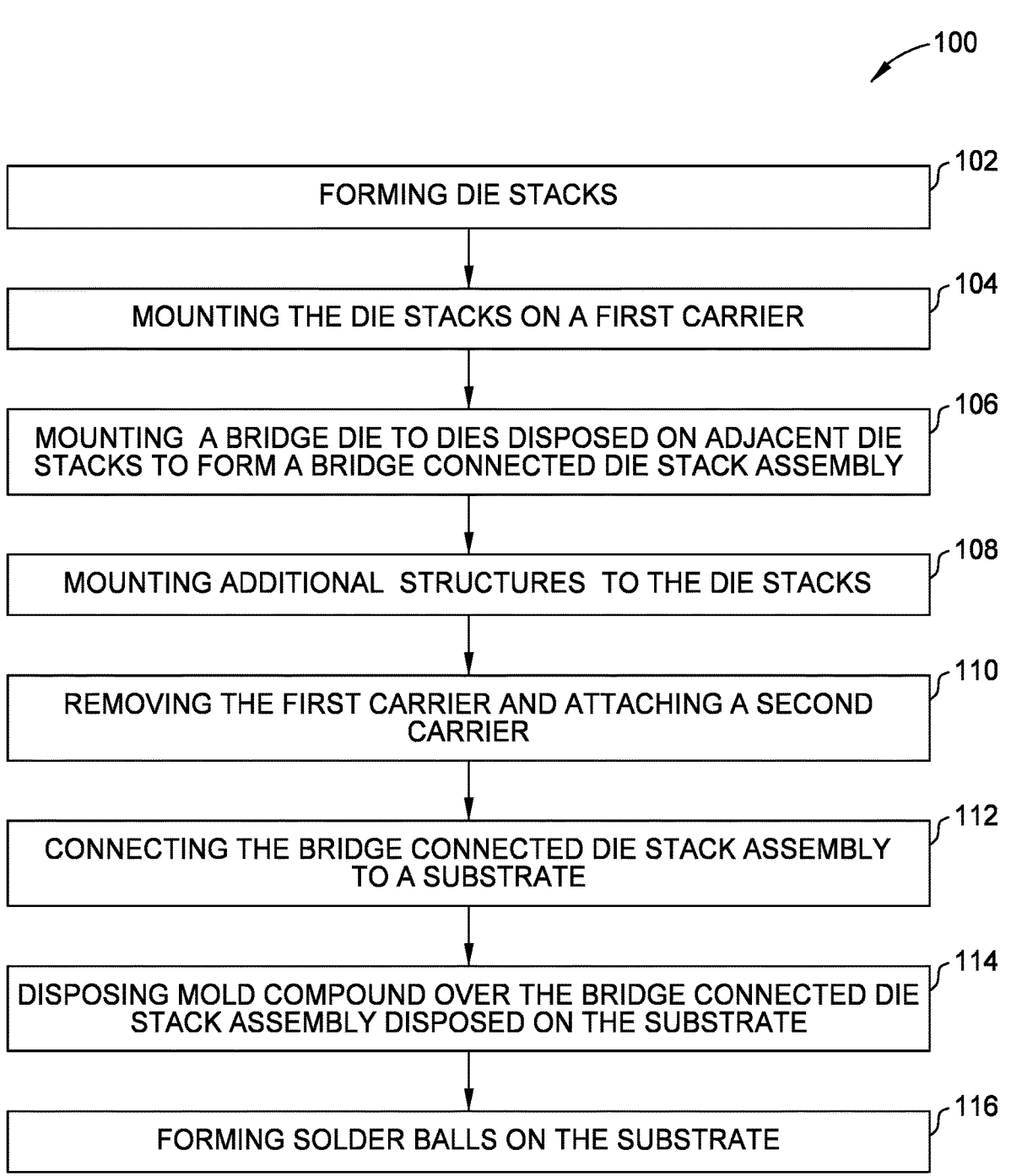
FIG. 1 is a flow diagram of a method for forming a chip package having a bridge die coupling adjacent die stacks.
Figure 9:
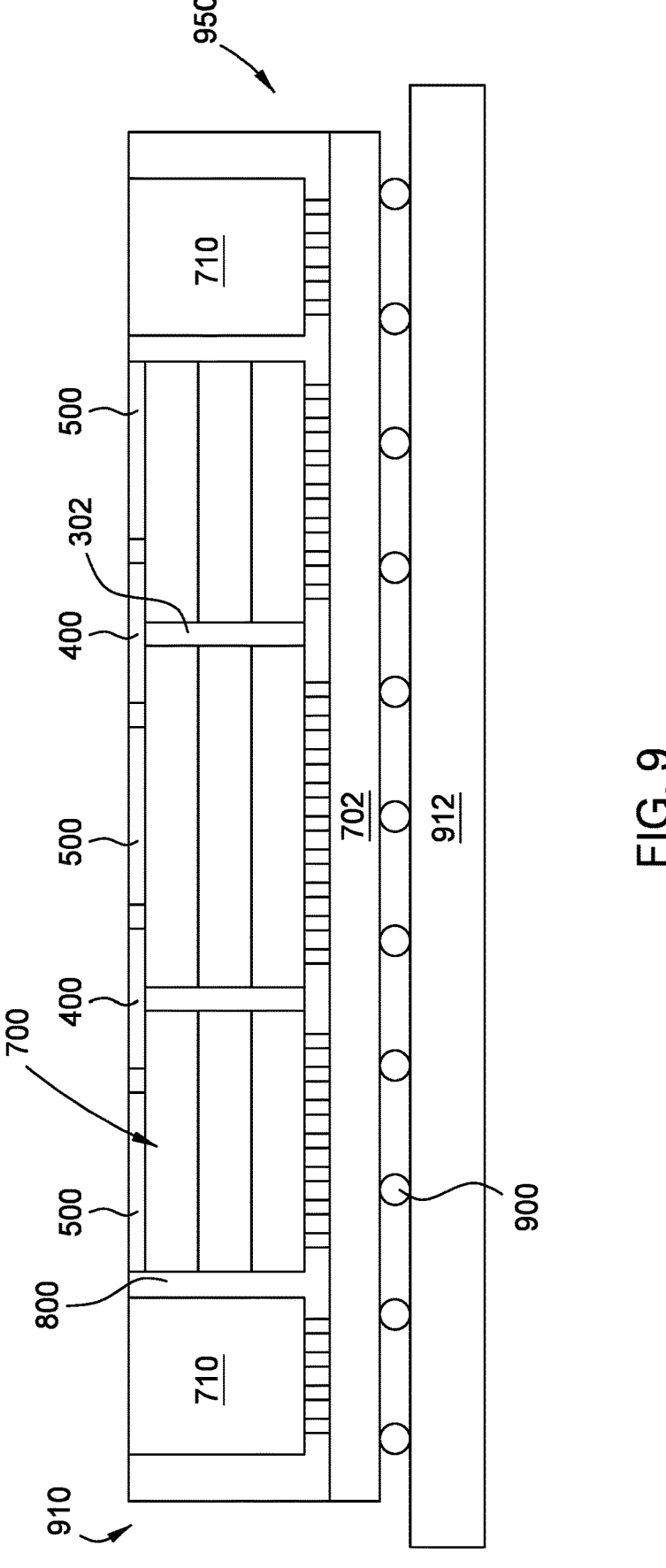

Turning now to FIG. 1, a flow diagram of a method 100 for forming a chip package having hybrid bonded bridge dies is provided. The chip package may be configured as illustrated in FIG. 9, or have another suitable configuration. FIGS. 2-9 are a schematic representation of one example of the chip package during different stages of fabrication according to the method 100 of FIG. 1.

Figure 2:
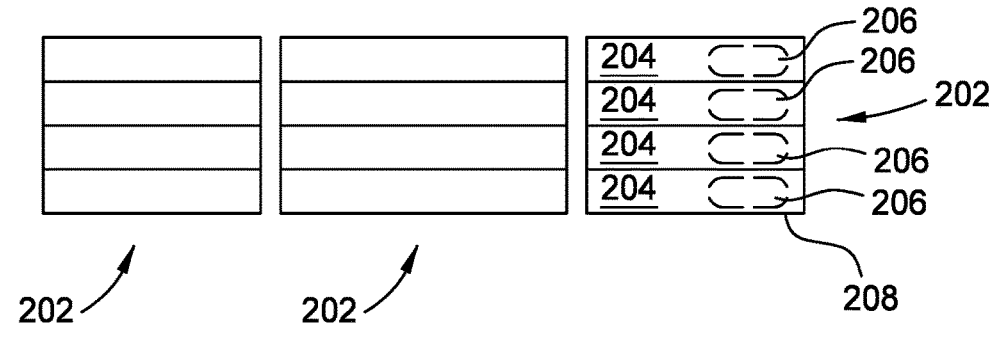
FIGS. 2-9 are a schematic representation of one example of a chip package having bridge dies coupling adjacent die stacks during different stages of fabrication according to the method of FIG. 1.

The method 100 begins at operation 102 by forming a die stack 202 as illustrated in FIG. 2. Each die stack 202 includes a plurality of integrated circuit (IC) dies 204 that are vertically stacked. Each die stack 202 may include one or more IC dies 204. In die stacks 202 having two more more IC dies 204, a top die is vertically stacked on top of a bottom die (with optionally intervening dies disposed in between the top and bottom dies). Optionally, one or more or all of the IC dies 204 within one or more of the die stacks 202 may be a chiplet. Although in the example depicted in FIG. 2 three die stacks 202 are shown, the chip package may include two or more die stacks 202.

Each of the IC dies 204 include a die body 208 having functional circuitry 206 formed in therein. The functional circuitry 206 may include block random access memory (BRAM), UltraRAM (URAM), digital signal processing (DSP) blocks, configurable logic elements (CLEs), and the like. The IC dies 204 may be, but are not limited to, programmable logic devices, such as field programmable gate arrays (FPGA), memory devices, such as high bandwidth memory (HBM), optical devices, processors or other IC logic structures. The IC dies 204 may optionally include optical devices such as photo-detectors, lasers, optical sources, and the like. In some examples, at least one of the IC dies 204 is a logic die having math processor (also known as math engine) circuitry for accelerating machine-learning math operations in hardware, such as self-driving cars, artificial intelligence and data-center neural-network applications. In another example, at least one of the IC dies 204 is a logic die, while the other IC dies 204 within the die stack 202 are memory devices.

The IC dies 204 within the die stack 202 are mechanically and electrically coupled together so that the functional circuitry 206 of one IC die 204 is in direct communication with the functional circuitry 206 of the vertically adjacent IC die 204. The vertically adjacent IC dies 204 may be coupled via solder connections, hybrid bonding, or other suitable technique. In the example depicted in FIG. 2, the adjacent IC dies 204 are coupled by hybrid bonding techniques. Hybrid bonding includes forming non-metal to non-metal bonds using fusion bonding, and forming metal-to-metal bonds across the adjacent IC dies 204. The metal-to-metal bonds may be formed using pressure and heat to form eutectic metal bonds. In one example, a hybrid bond is formed by bonding the dielectric materials surrounding the bond pads on each IC die 204 to first secure the IC dies 204 together, followed by an interfusion of the metal materials of the bond pads of the facing IC dies 204 to create the electric interconnect between the functional circuitry 206 of the one IC die 204 and the functional circuitry 206 of the vertically adjacent IC die 204.

Figure 3:
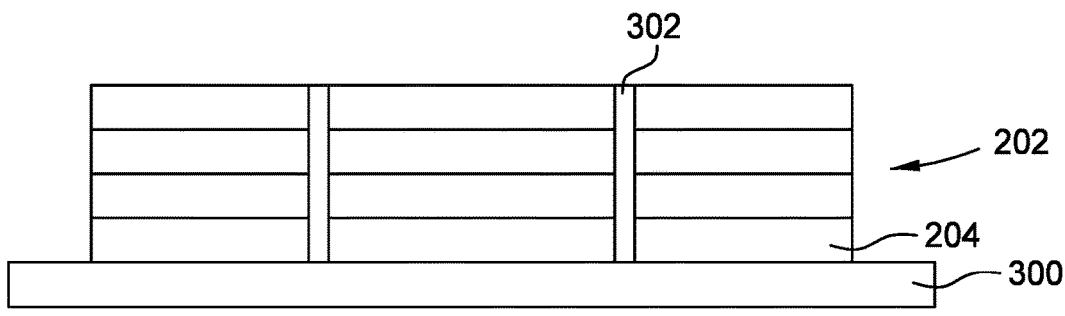

At operation 104, the IC die stacks 202 are mounted to a first temporary carrier 300 as illustrated in FIG. 3. Although three IC die stacks 202 are illustrated in FIG. 3 mounted to the first temporary carrier 300, the first temporary carrier 300 may be the size of a wafer such that significantly more than three IC die stacks 202 are mounted to the first temporary carrier 300. The IC die stacks 202 may be mounted to the first temporary carrier 300 using a temporary adhesive, such as a die attach film or tape. The first temporary carrier 300 may be any suitable rigid substrate that to which the last IC die 204 of the die stack 202 may be temporally secured during the later described bridge die hybrid bonding process. In one example, the first temporary carrier 300 is a metal plate, such as an aluminum plate. In another example, the first temporary carrier 300 is a glass or glass reinforced plastic plate.

After the IC die stacks 202 are attached to the carrier 300, a dielectric filler 302 is disposed between the IC die stacks 202, filling the gaps between the IC die stacks 202. The dielectric filler 302 may be an oxide, polymer, or other suitable material.

Figure 4:
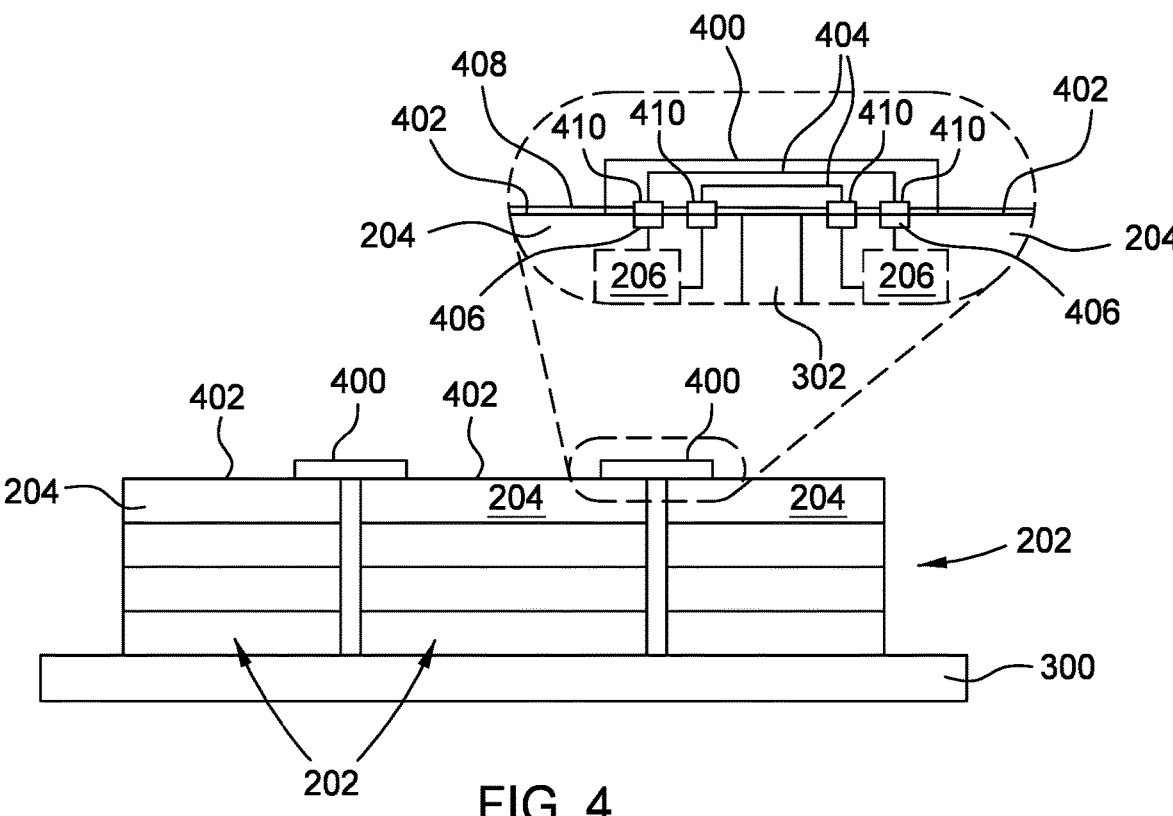

The method 100 continues to operation 106. At operation 106, a bridge die 400 is mounted to the IC dies 204 furthest from the first temporary carrier 300 (e.g., the top dies 204) of adjacent IC die stacks 202, as illustrated in FIG. 4. The bridge die 400 is hybrid bonded to the exposed top surface 402 of IC dies 204. The top surface 402 of IC dies 204 may optionally be thinned, for example by grinding, prior to attaching the bridge die 400. To facilitate hybrid bonding of the bridge die 400 to the exposed top surface 402 of IC dies 204, a dielectric layer 408 suitable for hybrid bonding is first deposited on the non-conducted areas of the exposed top surface 402 of IC dies 204. Materials suitable for the dielectric layer 408 include oxides, thermal oxides, $SiO_2$, SiN, SiCN, polybenzoxazole (PBO), polyimide (PI), benzocyclobutene (BCB), among others. The dielectric layer 408 allows the bridge die 400 to initially bond, for example by fusion bonding, to the exposed top surface 402 of IC dies 204. This is then followed by forming metal-to-metal bonds between the conductors of the bridge die 400 and the bond pads on each IC die 204 using pressure and heat to form eutectic metal bonds.

The hybrid bonding of the bridge die 400 to the exposed top surface 402 of each IC die 204 connects routing (e.g., solid state circuitry) 404 formed within the bridge die 400 to the contact pads 406 of each IC die 204. Thus, the functional circuitry 206 of the horizontally adjacent IC dies 204 are connected through the routing 404 formed within the bridge die 400. The hybrid bonding of the bridge die 400 provides a significantly denser pitch of connections between the contact pads 406 of the IC die 204 and the contact pads 410 of the bridge die 400. For example, the pitch of the contact pads 410 using hybrid bonds may have 6-9 µm spacing, which is significantly less than the typical 36 µm pitch spacing of contact pads used for conventional microbumps. As such, the dense spacing of the contact pads 410 of the bridge die 400 enables about 10 or more times the electrical connections across the hybrid bond interface than could be achieved using conventional solder-based connections. As a result, the communication bandwidth between the bridge die 400 and IC dies 204 hybrid bonded thereto is significantly greater than conventional devices that utilize solder-based connections between dies in adjacent die stacks.

Figures 5, 6:
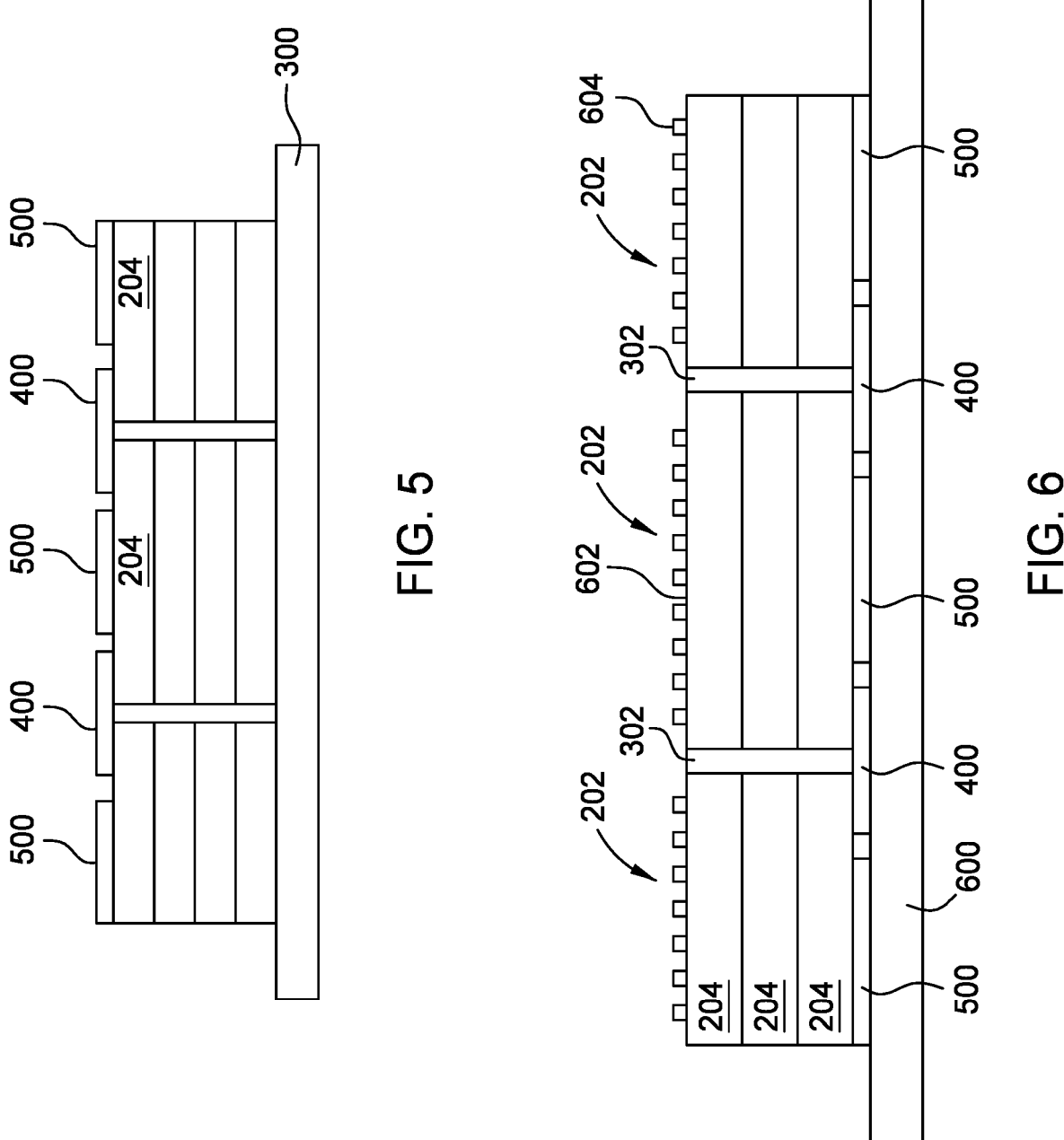

At an optional operation 108, spacers are mounted to the exposed top surface 402 of the IC dies 204, as illustrated in FIG. 5. In FIG. 5, the spacers are embodied as additional structures 500. The additional structures 500 may be dummy dies, passive devices, processor dies, memory dies or chiplets, or other types of dies or chiplets. In the example depicted in FIG. 5, the additional structures 500 are memory dies, such as static random-access memory (SRAM). In another example, the additional structures 500 are passive devices, such as deep trench capacitors.

At operation 110, the first temporary carrier 300 is removed and a second temporary carrier 600 is attached to the exposed surface of the bridge die 400, as illustrated in FIG. 6. The second temporary carrier 600 may be similar to the first temporary carrier 300, and may be attached to the IC die stacks 202 using a temporary adhesive, such as a die attach film or tape.

Also at operation 110, the exposed surfaces 602 of the first IC die 204 of the die stacks 202 have microbumps plated thereon for later attachment to a substrate of the chip package, such as an interposer or package substrate. Additionally at operation 110, the die stacks 202 on the second temporary carrier 600 are diced to form a bridge connected die stack assemblies 700, one of which is shown in FIG. 7.

At operation 112, the bridge connected die stack assembly 700 is then electrically and physically connected to an interconnect routing structure. In FIG. 7, the interconnect routing structure is embodied as a substrate 702, such as an interposer or package substrate. The bridge connected die stack assembly 700 may be electrically and physically connected to the substrate 702 via hybrid bonding, solder connection, or suitable technique. Prior to connecting to the substrate 702, the second temporary carrier 600 is removed from the bridge connected die stack assembly 700. When solder connections are utilized to couple the substrate 702 to the IC dies 204 of the bridge connected die stack assembly 700, the density the contact pads 410 of the bridge die 400 due to hybrid bonding is about 10 or more times denser than the density of the electrical connections across the solder connection interface between the substrate 702 and the IC dies 204.

Optionally at operation 112, additional devices 710 may be electrically and physically connected to the substrate 702 outward of the bridge connected die stack assembly 700. The additional devices 710 may be electrically and physically connected to the substrate 702 in the same manner at the bridge connected die stack assembly 700. In the embodiment depicted in FIG. 7, the additional devices 710 are one or more memory devices. The memory devices may be a stack of memory IC dies, such as a high bandwidth memory (HM) stack. The additional devices 710 may alternatively be a chiplet or other type of IC die. The additional devices 710 are coupled to the IC dies 204 through routing 712 formed in the substrate 702.

Figures 7, 8:
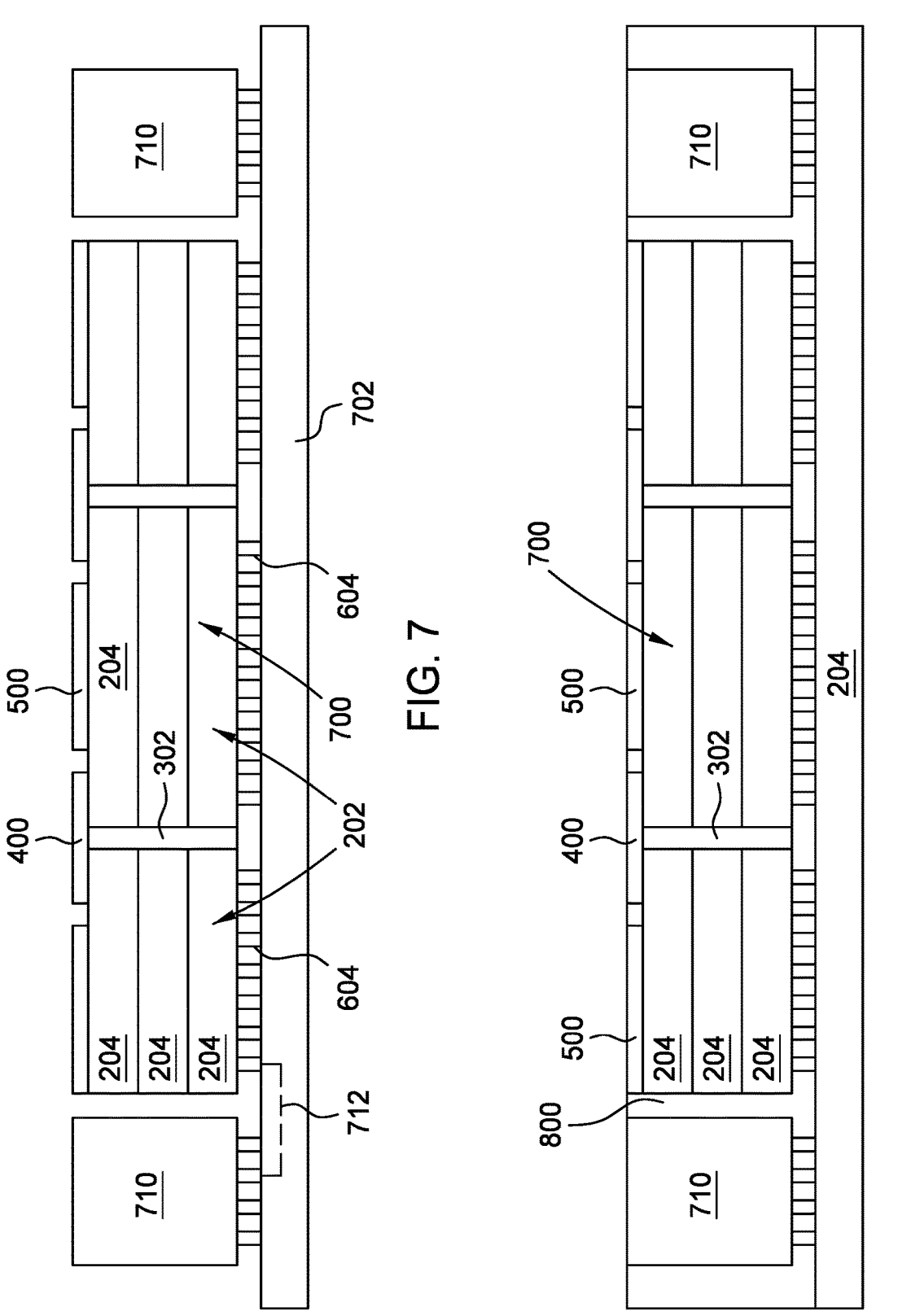

At operation 114, the mold compound 800 is disposed over the additional devices 710, as illustrated in FIG. 8. The mold compound 800 is also disposed between the bridge dies 400 and the additional structures 500, and in contact with the IC dies 204. Application of the mold compound 800 at operation 112 may also include providing an underfill between the die stacks 202 and the substrate 702.

At operation 116, solder balls 900 are form on the substrate 702 to form the chip package 910, as illustrated in FIG. 9. The solder balls 900 are used to connect the substrate 702 of the chip package 910 to a printed circuit board (PCB) 912 to form an electronic device 950. In other embodiments, the substrate 702 may be in the form of an interposer, and rather than a PCB 912, the interposer substrate 702 is coupled by the solder balls 900 to a package substrate (in the position of the PCB 912) to form the chip package 910.

Figure 10:
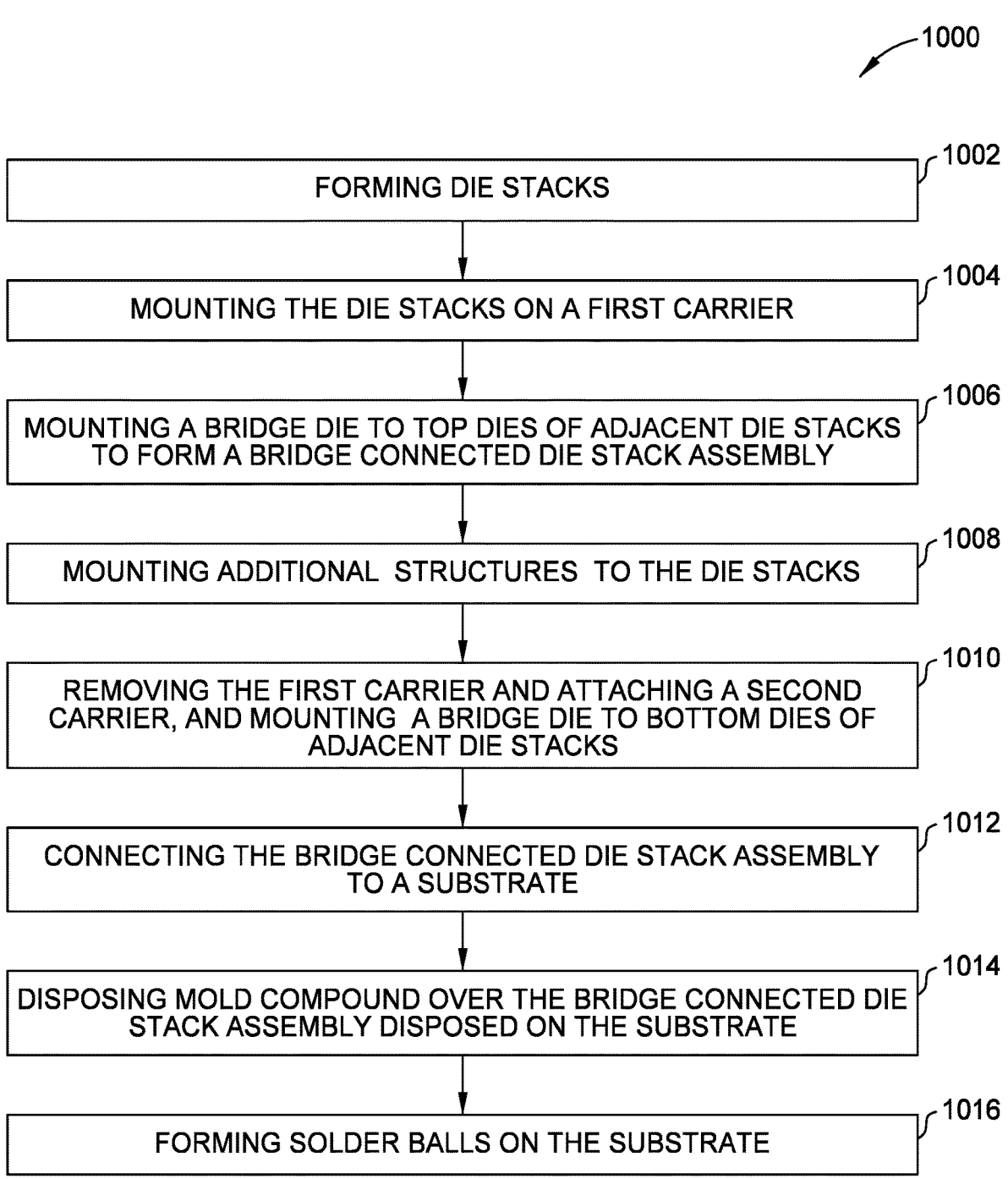
FIG. 10 is a flow diagram of another method for forming a chip package having a bridge die coupling adjacent die stacks.
Figures 13, 14:
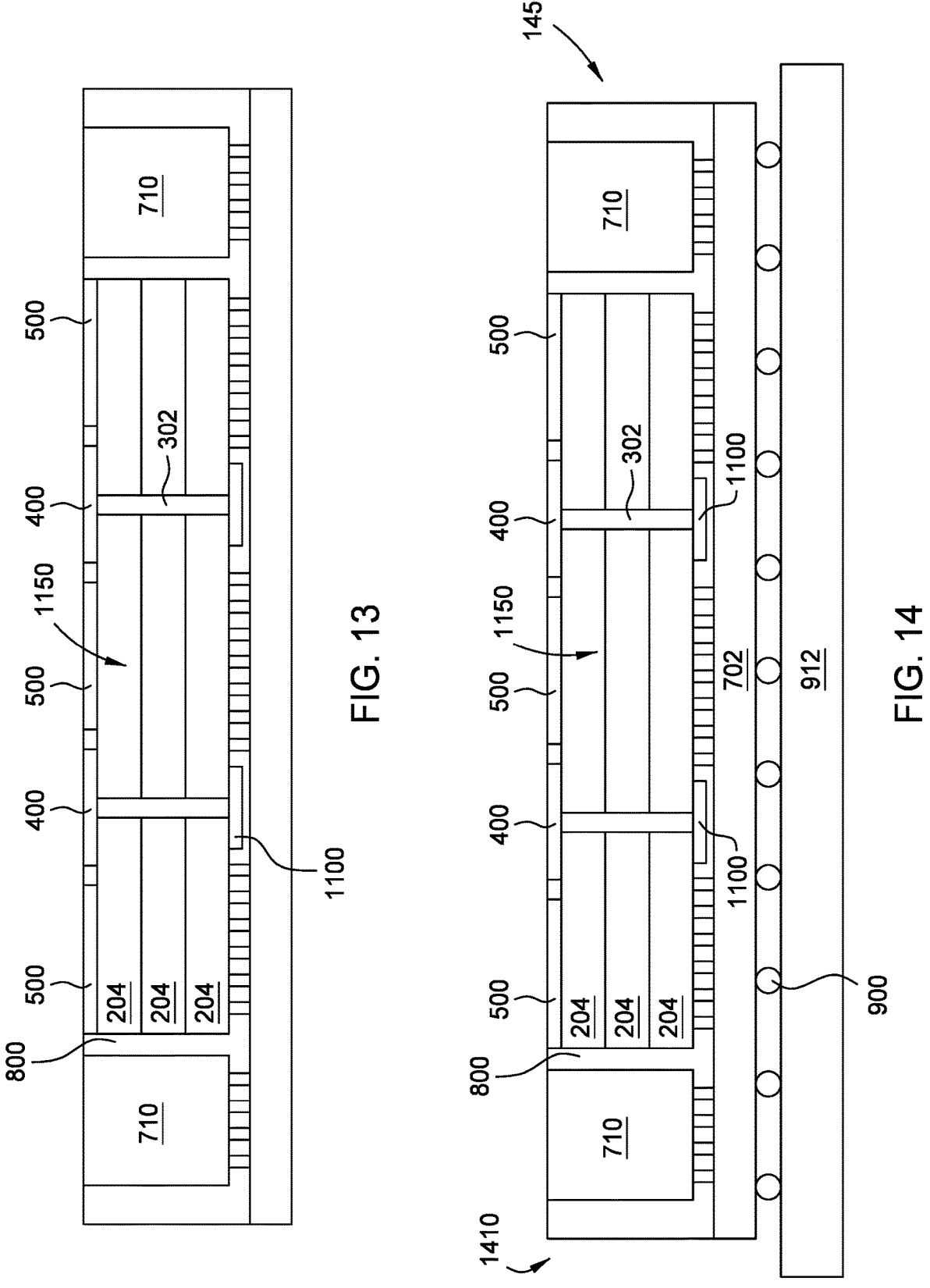

FIG. 10 depicts a flow diagram of another method 1000 for forming a chip package having hybrid bonded bridge dies. The chip package may be configured as illustrated in FIG. 14 or have another suitable configuration. FIGS. 2-5 and 11-14 are a schematic representation of one example of the chip package during different stages of fabrication according to the method 1000 of FIG. 10.

The method 1000 shares the same first four operations as the method 100 described above. The method begins at operation 1002, which similar to operation 102, forms a die stack 202 as illustrated in FIG. 2. At operation 1004, which similar to operation 104, the IC die stacks 202 are mounted to a first temporary carrier 300 as illustrated in FIG. 3. After the IC die stacks 202 are attached to the carrier 300, a dielectric filler 302 is disposed between the IC die stacks 202, filling the gaps between the IC die stacks 202. The At operation 1006, which is similar to operation 106, a bridge die 400 is mounted to the IC dies 204 furthest from the first temporary carrier 300 on adjacent IC die stacks 202 (i.e., the top IC dies 204), as illustrated in FIG. 4. The bridge die 400 is hybrid bonded to the exposed top surface 402 of IC dies 204. The top surface 402 of IC dies 204 may optionally be thinned.

The hybrid bonding of the bridge die 400 to the exposed top surface 402 of each IC die 204 connects the routing 404 within the bridge die 400 to the contact pads 406 of each IC die 204. Thus, the functional circuitry 206 of each the IC die 204 is connected through the routing 404 within the bridge die 400. The hybrid bonding of the bridge die 400 allows for a significantly denser pitch to be used to connect the contact pads 406 of the IC die 204 to the contact pads 410 of the bridge die 400.

At an optional operation 1008, which is similar to operation 108, additional structures 500 are mounted to the exposed top surface 402 of the IC dies 204, as illustrated in FIG. 5. The additional structures 500 may be dummy dies, passive devices, memory dies or chiplets, or other types of dies or chiplets.

Figures 11, 12:
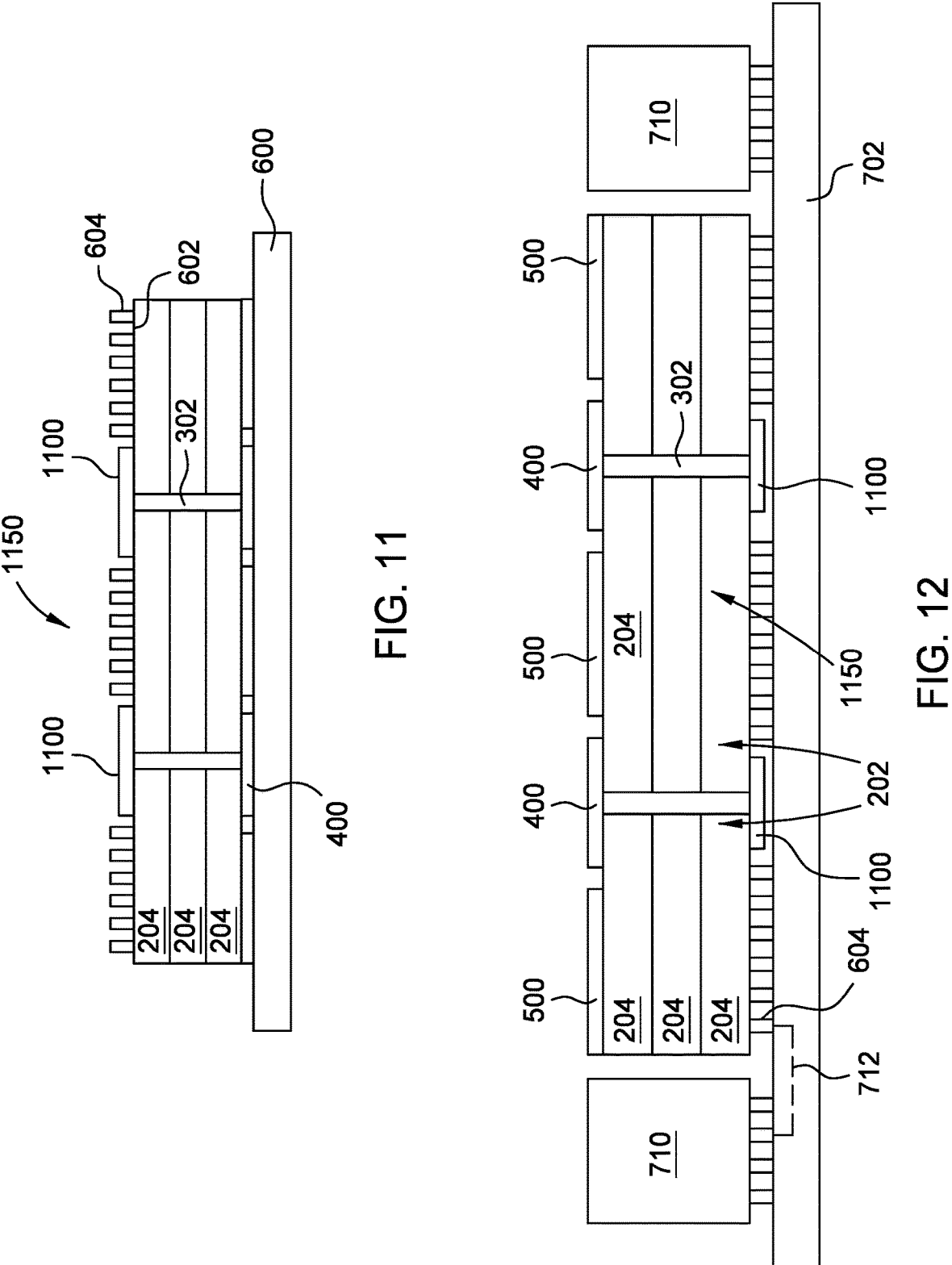
FIGS. 11-14 are a schematic representation of one example of a chip package having bridge dies coupling adjacent die stacks during different stages of fabrication according to the method of FIG. 10.

At operation 1010, the first temporary carrier 300 is removed and a second temporary carrier 600 is attached to the exposed surface of the bridge die 400, as illustrated in FIG. 11. The second temporary carrier 600 may be similar to the first temporary carrier 300, and may be attached to the IC die stacks 202 using a temporary adhesive, such as a die attach film or tape.

Also at operation 1010, an internal bridge die 1100 is mounted to the IC dies 204 furthest from the second temporary carrier 600 on adjacent IC die stacks 202 (i.e., the bottom IC dies 204), as illustrated in FIG. 11. The internal bridge die 1100 is hybrid bonded to the exposed bottom surface 602 of IC dies 204. The bottom surface 602 of IC dies 204 may optionally be thinned prior to bonding the internal bridge die 1100 thereto. The internal bridge die 1100 is hybrid bonded to the bottom surface 602 of IC dies 204 in the same manner that the bridge die 400 is hybrid bonded to the top surface 402 of IC dies 204. Having bridge dies 400, 1100 hybrid bonded to both sides of the adjacent die stacks 202 significantly increases the amount of routings between the adjacent die stacks 202.

At operation 1010, the exposed surfaces 602 of the first IC die 204 of the die stacks 202 have microbumps 604 plated thereon for later attachment to a substrate of the chip package, such as an interposer or package substrate. Additionally at operation 1010, the die stacks 202 on the second temporary carrier 600 are diced to form bridge connected die stack assemblies 1150, one of which is shown in FIG. 12.

At operation 1012, the bridge connected die stack assembly 1150 is then electrically and physically connected to an interconnect routing structure. In FIG. 12, the interconnect routing structure is embodied as a substrate 702, such as an interposer or package substrate. The bridge connected die stack assembly 1150 may be electrically and physically connected to the substrate 702 via hybrid bonding, solder connection, or suitable technique. Prior to connecting to the substrate 702, the second temporary carrier 600 is removed from the bridge connected die stack assembly 1150.

Optionally at operation 1012, additional devices 710 may be electrically and physically connected to the substrate 702 outward of the bridge connected die stack assembly 1150. The additional devices 710 may be electrically and physically connected to the substrate 702 in the same manner at the bridge connected die stack assembly 1150. In the embodiment depicted in FIG. 12, the additional devices 710 are one or more memory devices. The memory devices may be a stack of memory IC dies, such as a high bandwidth memory (HM) stack. The additional devices 710 may alternatively be a chiplet or other type of IC die. The additional devices 710 are coupled to the IC dies 204 through routing 712 formed in the substrate 702.

At operation 1014, the mold compound 800 is disposed over the additional devices 710, as illustrated in FIG. 13. The mold compound 800 is also disposed between the bridge dies 400 and the additional structures 500, and in contact with the IC dies 204. Application of the mold compound 800 at operation 112 may also include providing an underfill between the die stacks 202 and the substrate 702.

At operation 1016, solder balls 900 are form on the substrate 702 to form the chip package 1410, as illustrated in FIG. 14. The solder balls 900 are used to connect the substrate 702 of the chip package 1410 to a printed circuit board (PCB) 912 to form an electronic device 1450. In other embodiments, the substrate 702 may be in the form of an interposer, and rather than a PCB 912, the interposer substrate 702 is coupled by the solder balls 900 to a package substrate (in the position of the PCB 912) to form the chip package 1410.

FIG. 15 depicts a flow diagram of another method 1500 for forming a chip package having hybrid bonded bridge dies and a redistribution layer that functions as an interconnect routing structure. The chip package may be configured as illustrated in FIG. 19 or have another suitable configuration. FIGS. 2-5 and 16-19 are a schematic representation of one example of the chip package during different stages of fabrication according to the method 1500 of FIG. 15.

The method 1500 shares the some of the first operations as the method 100 described above. The method begins at operation 1502, which similar to operation 102, forms a die stack 202 as illustrated in FIG. 2. At operation 1504, which similar to operation 104, the IC die stacks 202 are mounted to a first temporary carrier 300 as illustrated in FIG. 3. After the IC die stacks 202 are attached to the carrier 300, a dielectric filler 302 is disposed between the IC die stacks 202, filling the gaps between the IC die stacks 202. At operation 1506, which is similar to operation 106, a bridge die 400 is mounted to the IC dies 204 furthest from the first temporary carrier 300 on adjacent IC die stacks 202, as illustrated in FIG. 4. The bridge die 400 is hybrid bonded to the exposed top surface 402 of IC dies 204. The top surface 402 of IC dies 204 may optionally be thinned.

The hybrid bonding of the bridge die 400 to the exposed top surface 402 of each IC die 204 connects the routing 404 within the bridge die 400 to the contact pads 406 of each IC die 204. Thus, the functional circuitry 206 of each the IC die 204 is connected through the routing 404 within the bridge die 400. The hybrid bonding of the bridge die 400 allows for a significantly denser pitch to be used to connect the contact pads 406 of the IC die 204 to the contact pads 410 of the bridge die 400.

Although not shown in the flow diagram of the method 1500 illustrated in FIG. 15, the method 1500 may include optional operations, such as an operation similar to operation 108 where additional structures 500 are mounted to the exposed top surface 402 of the IC dies 204, as illustrated in FIG. 5. The additional structures 500 may be dummy dies, passive devices, memory dies or chiplets, or other types of dies or chiplets.

Figure 16:
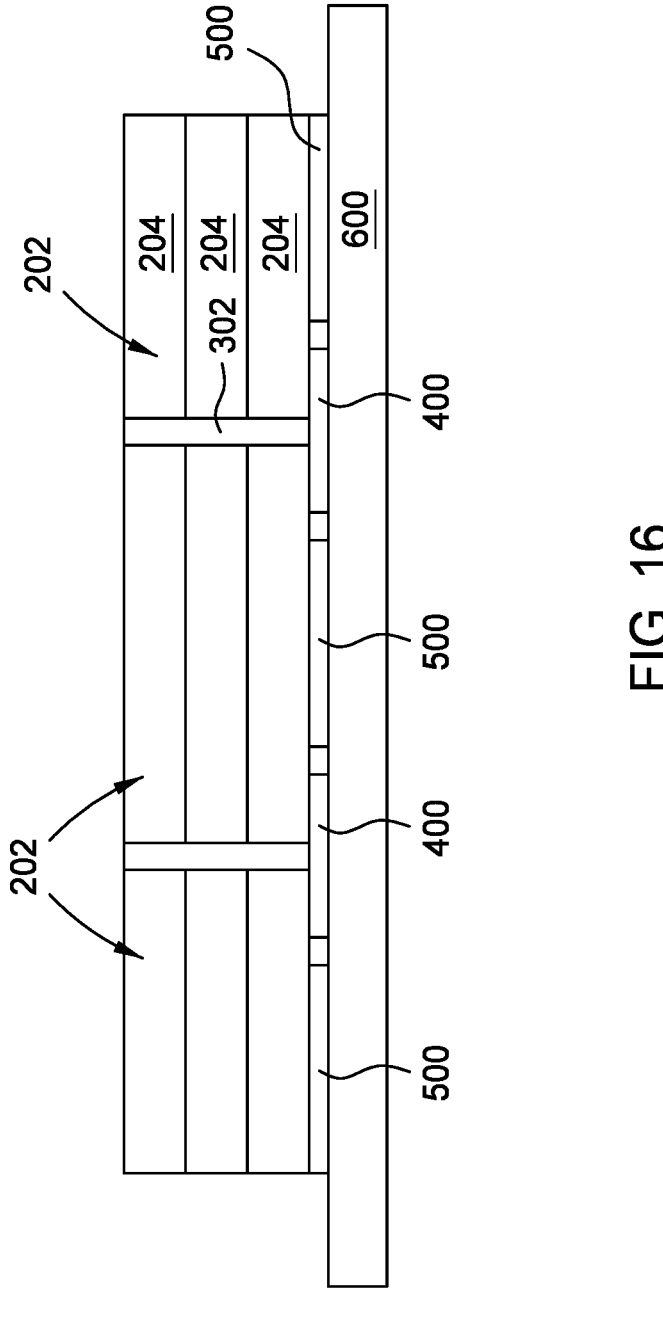
FIGS. 16-19 are a schematic representation of one example of a chip package having bridge dies coupling adjacent die stacks during different stages of fabrication according to the method of FIG. 15.

At operation 1508, the first temporary carrier 300 is removed and a second temporary carrier 600 is attached to the exposed surface of the bridge die 400, as illustrated in FIG. 16. The second temporary carrier 600 may be similar to the first temporary carrier 300, and be attached to the IC die stacks 202 may be mounted to the first temporary carrier 300 using a temporary adhesive, such as a die attach film or tape.

Figure 17:
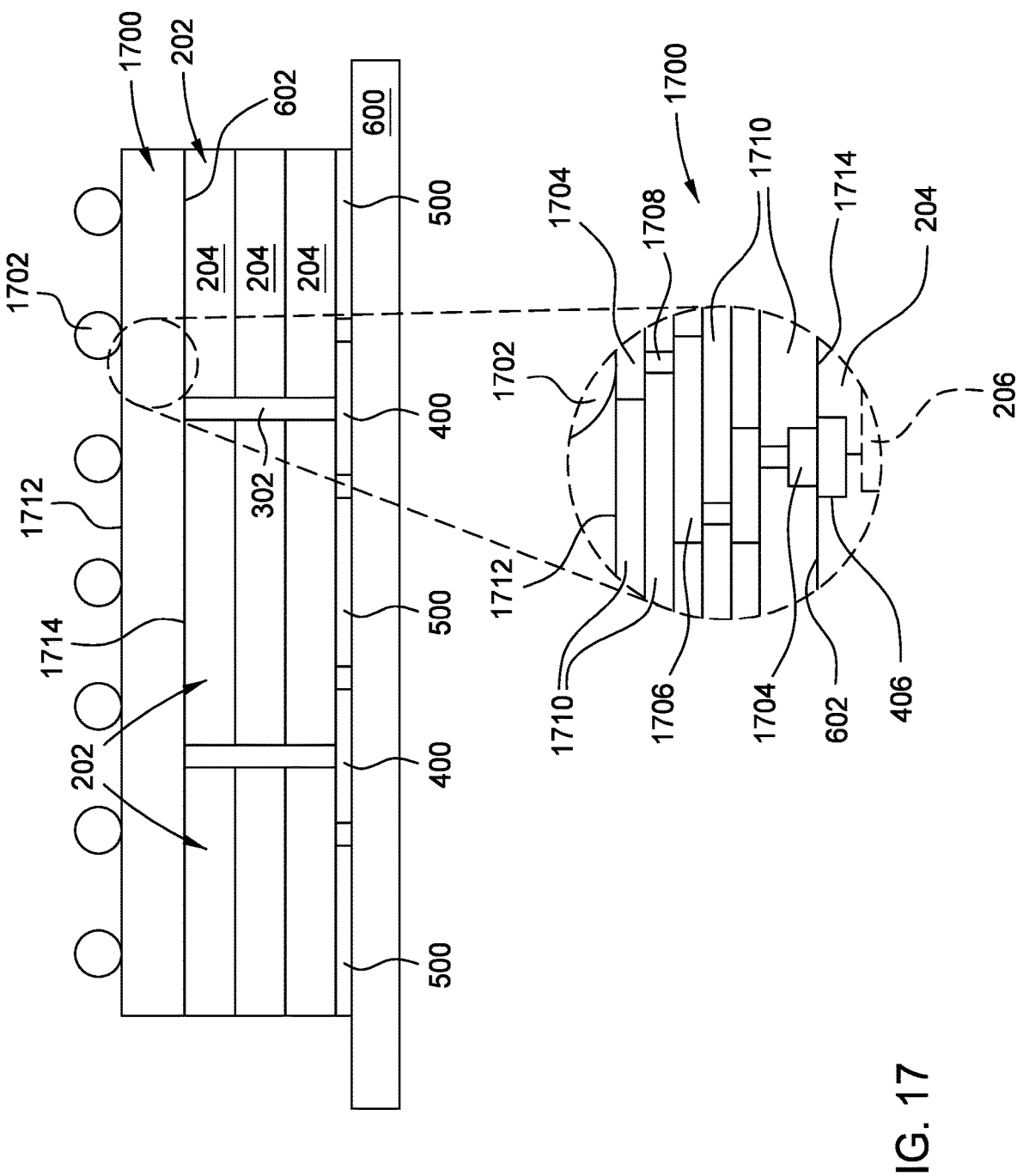
Figures 18, 19:
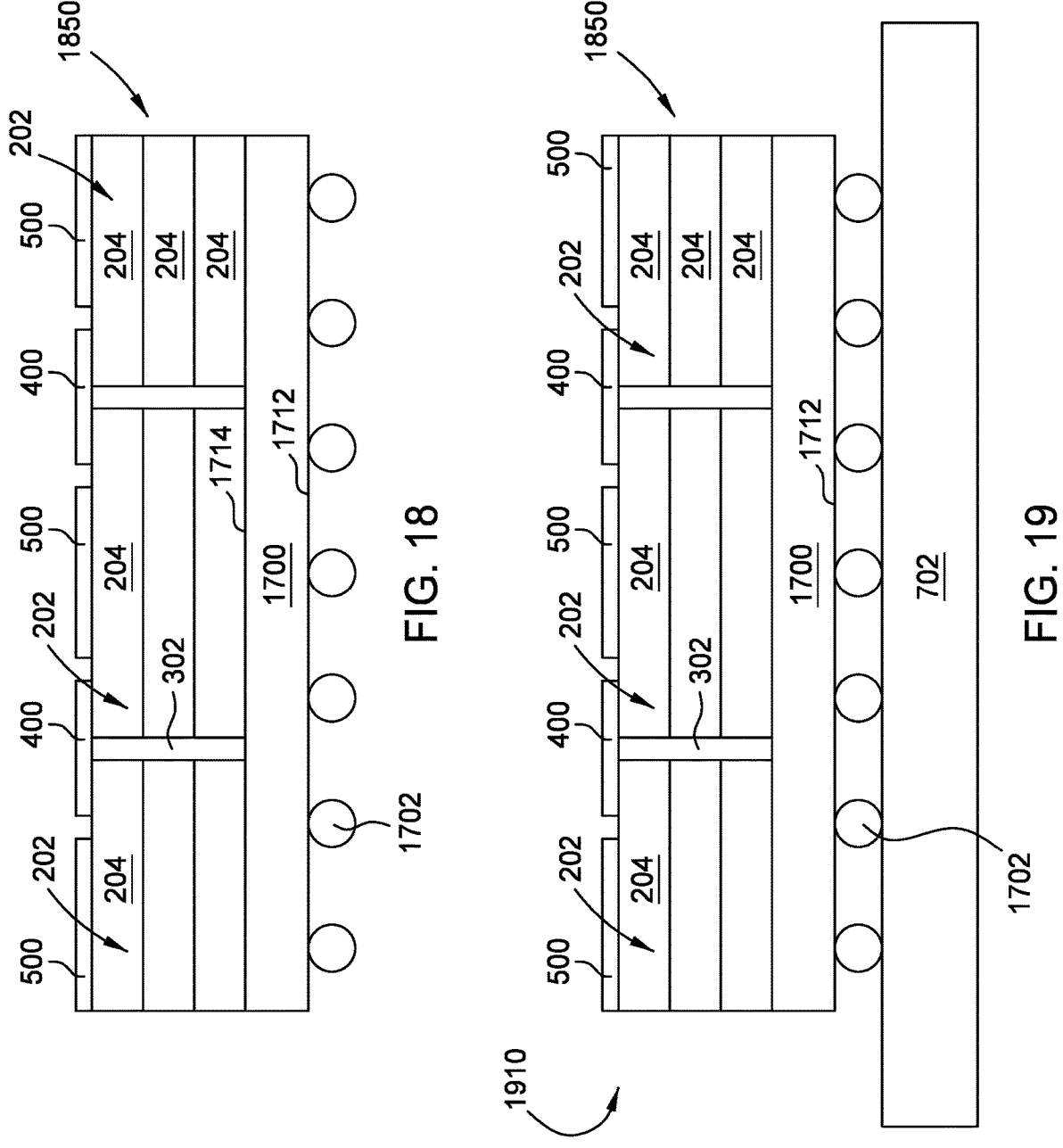

At operation 1510, an interconnect routing structure is formed on the exposed surfaces 602 of the first IC die 204 of the die stacks 202 located furthest from the second temporary carrier 600, as illustrated in FIG. 17. In FIG. 17, the interconnect routing structure is embodied as a redistribution layer 1700. The redistribution layer 1700 includes three or more patterned metal layers disposed between dielectric layers 1710. The patterned metal layers are used to form pads 1704 and lines 1706 that are interconnected by vias 1708 to form electrical routing circuitry through the redistribution layer 1700. The electrical routing circuitry through the redistribution layer 1700 is utilized to connect solder connections 1702 (such as a solder ball or other interconnect) to the functional circuitry 206 of the IC die 204. In the example depicted in FIG. 17, one pad 1704 of the routing circuitry of the redistribution layer 1700 terminates at the solder connections 1702, while the other pad 1704 of the routing circuitry of the redistribution layer 1700 is in contact with the contact pad 406 of the IC die 204. In this manner, the top surface 1714 of the redistribution layer 1700 is formed directly on the exposed bottom surface 602 of the IC die 204 without any intervening solder connections.

After the redistribution layer 1700 is formed on the IC dies 204, solder connections 1702 are plated or otherwise formed on the pads 1704 of the redistribution layer 1700.

At operation 1512, the second temporary carrier 600 is removed from the bridge connected die stack assembly 1850, as illustrated in FIG. 18. At operation 1514, the bridge connected die stack assembly 1850 is then electrically and physically connected to a substrate 702, such as an interposer or package substrate, to form the chip package 1910 as shown in FIG. 19. The bridge connected die stack assembly 1850 may be electrically and physically connected to the substrate 702 via hybrid bonding, solder connection, or suitable technique.

Although not shown in FIG. 18, solder balls may be used to connect the chip package 1910 to a printed circuit board (PCB) to form an electronic device, such as described above and shown in FIG. 14. In other embodiments, the substrate 702 may be in the form of an interposer, and rather than a PCB 912, the interposer substrate 702 is coupled by the solder balls to a package substrate to form the chip package 1910.

Figure 20:
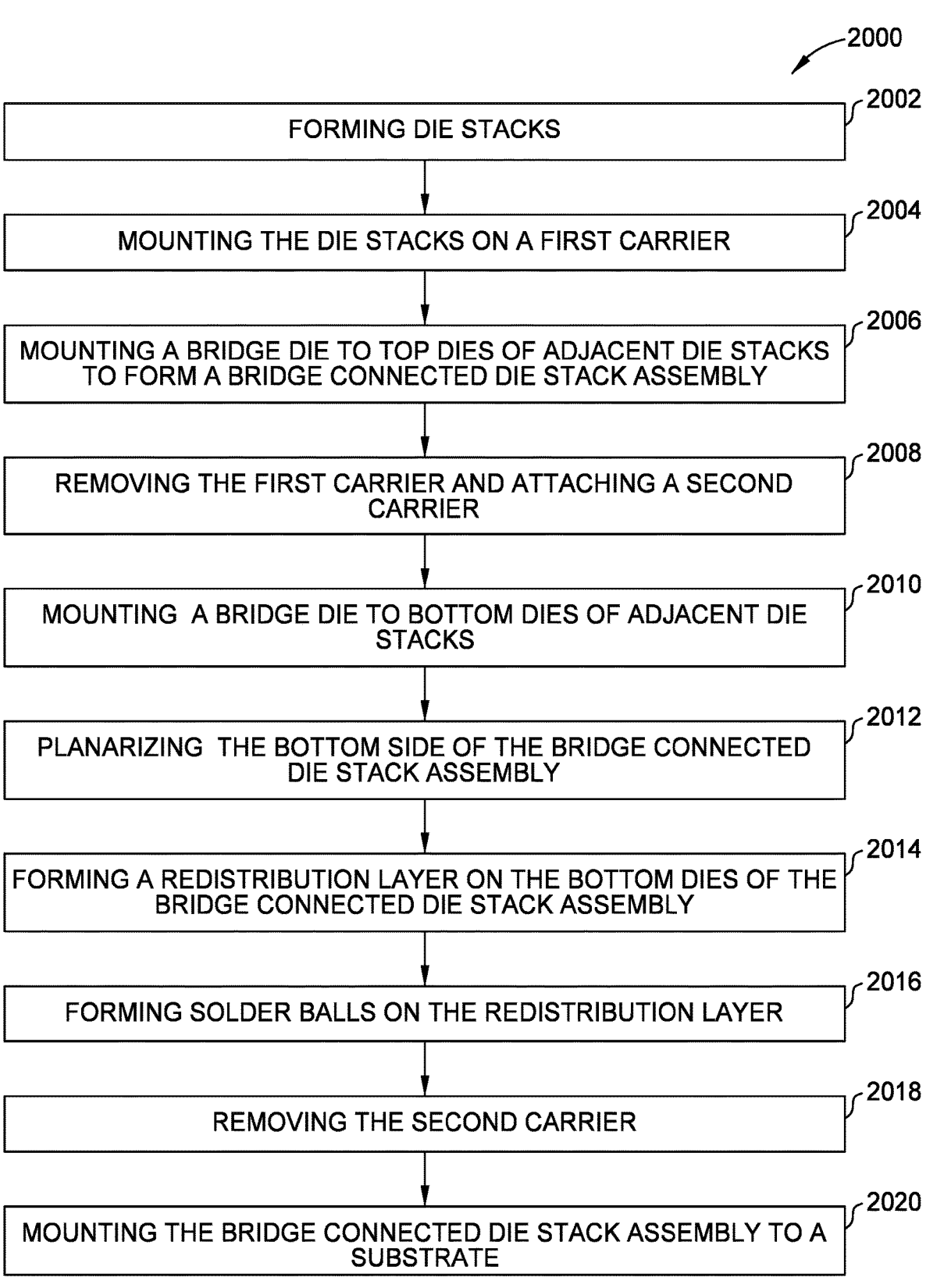
FIG. 20 is a flow diagram of yet another method for forming a chip package having a bridge die coupling adjacent die stacks.

FIG. 20 depicts a flow diagram of another method 2000 for forming a chip package having hybrid bonded bridge dies disposed on top and bottom sides of a dies stack, the chip package also having a redistribution layer that functions as an interconnect routing structure. The chip package may be configured as illustrated in FIG. 27 or have another suitable configuration. FIGS. 2-5 and 21-27 are a schematic representation of one example of the chip package during different stages of fabrication according to the method 2000 of FIG. 20.

The method 2000 shares the some of the first operations as the method 100 described above. The method begins at operation 2002, which similar to operations 102, forms a die stack 202 as illustrated in FIG. 2. At operation 2004, which similar to operation 104, the IC die stacks 202 are mounted to a first temporary carrier 300 as illustrated in FIG. 3. After the IC die stacks 202 are attached to the carrier 300, a dielectric filler 302 is disposed between the IC die stacks 202, filling the gaps between the IC die stacks 202. At operation 2006, which is similar to operation 106, a bridge die 400 is mounted to the IC dies 204 furthest from the first temporary carrier 300 on adjacent IC die stacks 202, as illustrated in FIG. 4. The bridge die 400 is hybrid bonded to the exposed top surface 402 of IC dies 204. The top surface 402 of IC dies 204 may optionally be thinned.

The hybrid bonding of the bridge die 400 to the exposed top surface 402 of each IC die 204 connects the routing 404 within the bridge die 400 to the contact pads 406 of each IC die 204. Thus, the functional circuitry 206 of each the IC die 204 is connected through the routing 404 within the bridge die 400. The hybrid bonding of the bridge die 400 allows for a significantly denser pitch to be used to connect the contact pads 406 of the IC die 204 to the contact pads 410 of the bridge die 400.

Although not shown in the flow diagram of the method 2000 illustrated in FIG. 20, the method 2000 may include optional operations, such as operation 108 in which additional structures 500 are mounted to the exposed top surface 402 of the IC dies 204, as illustrated in FIG. 5. The additional structures 500 may be dummy dies, passive devices, memory dies or chiplets, or other types of dies or chiplets.

Figure 21:
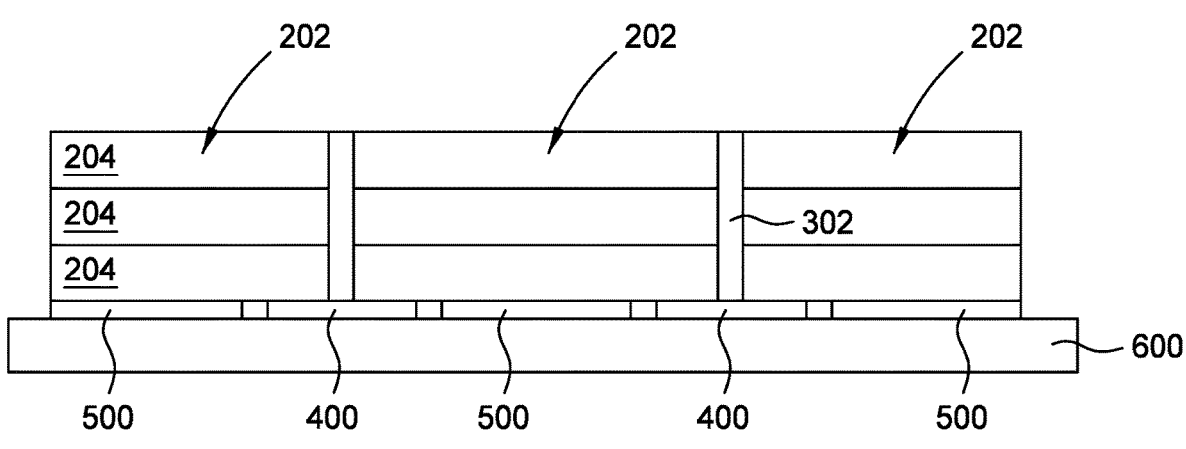
FIGS. 21-27 are a schematic representation of one example of a chip package having bridge dies coupling adjacent die stacks during different stages of fabrication according to the method of FIG. 20.

At operation 2008, the first temporary carrier 300 is removed and a second temporary carrier 600 is attached to the exposed surface of the bridge die 400, as illustrated in FIG. 21. The second temporary carrier 600 may be similar to the first temporary carrier 300, and may be attached to the IC die stacks 202 using a temporary adhesive, such as a die attach film or tape.

Figure 22:
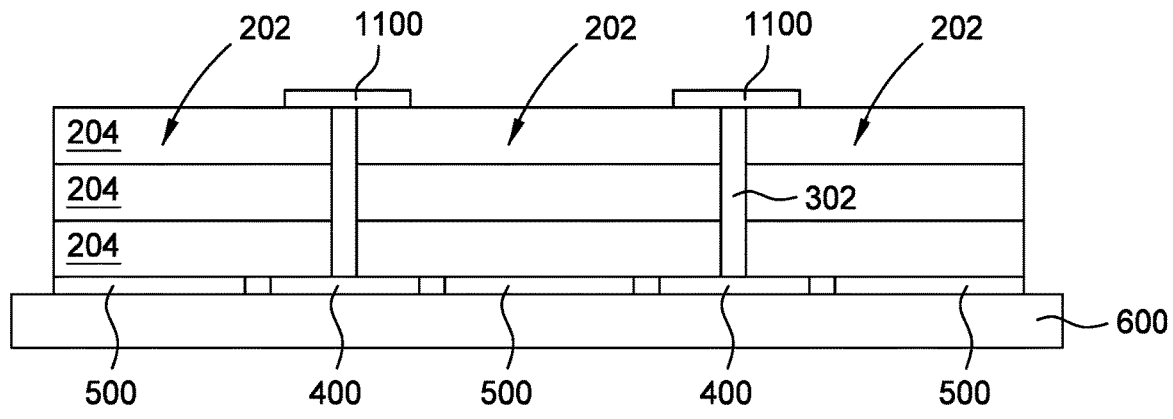

At operation 2010, an internal bridge die 1100 is mounted to the IC dies 204 furthest from the second temporary carrier 600 on adjacent IC die stacks 202, as illustrated in FIG. 22. The internal bridge die 1100 is hybrid bonded to the exposed bottom surface 602 of IC dies 204. The bottom surface 602 of IC dies 204 may optionally be thinned prior to bonding the internal bridge die 1100 thereto. The internal bridge die 1100 is hybrid bonded to the bottom surface 602 of IC dies 204 in the same manner that the bridge die 400 is hybrid bonded to the top surface 402 of IC dies 204. Having bridge dies 400, 1100 hybrid bonded to both sides of the adjacent die stacks 202 significantly increases the amount of routings between the adjacent die stacks 202.

Figure 23:
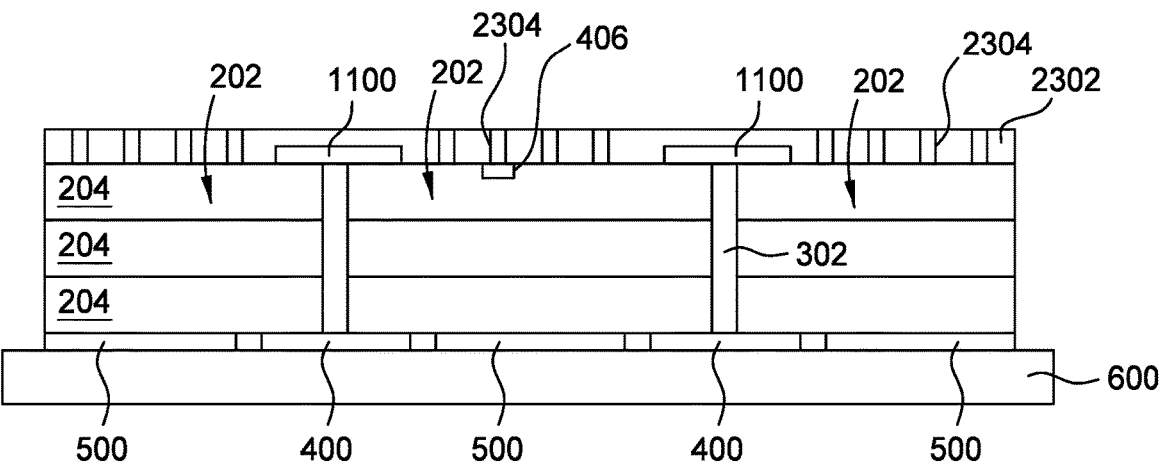

At operation 2012, a dielectric layer 2302 is disposed on the bottom surface 602 of IC dies 204 covering the internal bridge die 1100, as illustrated in FIG. 23. A plurality of conductive pillars 2304 extend through the dielectric layer 2302. Each conductive pillar 2304 is in electrical contact with one of the pads 406 of one of the IC dies 204. The conductive pillars 2304 may be formed the pads 406 prior to depositing the dielectric layer 2302, for example by plating. Alternatively, holes may be formed in the dielectric layer 2302 in which the pillars 2304 are formed in contact with the pads 406.

An interconnect routing structure is formed on the exposed surfaces 602 of the first IC die 204 of the die stacks 202 located furthest from the second temporary carrier 600. As described above with reference to FIG. 17, the interconnect routing structure is embodied as a redistribution layer 1700 that includes three or more patterned metal layers disposed between dielectric layers 1710. The patterned metal layers are used to form pads 1704 and lines 1706 that are interconnected by vias 1708 to form electrical routing circuitry through the redistribution layer 1700. The electrical routing circuitry through the redistribution layer 1700 is utilized to connect solder connections 1702 (such as a solder ball or other interconnect) to the functional circuitry 206 of the IC die 204. In the example depicted in FIG. 24, one pad 1704 of the routing circuitry of the redistribution layer 1700 terminates at the solder connections 1702, while the other pad 1704 of the routing circuitry of the redistribution layer 1700 is in contact with the contact pad 406 of the IC die 204. In this manner, the top surface 1714 of the redistribution layer 1700 is formed directly on the dielectric layer 2302 that is formed directly on the exposed bottom surface 602 of the IC die 204 without any intervening solder connections.

Figure 24:
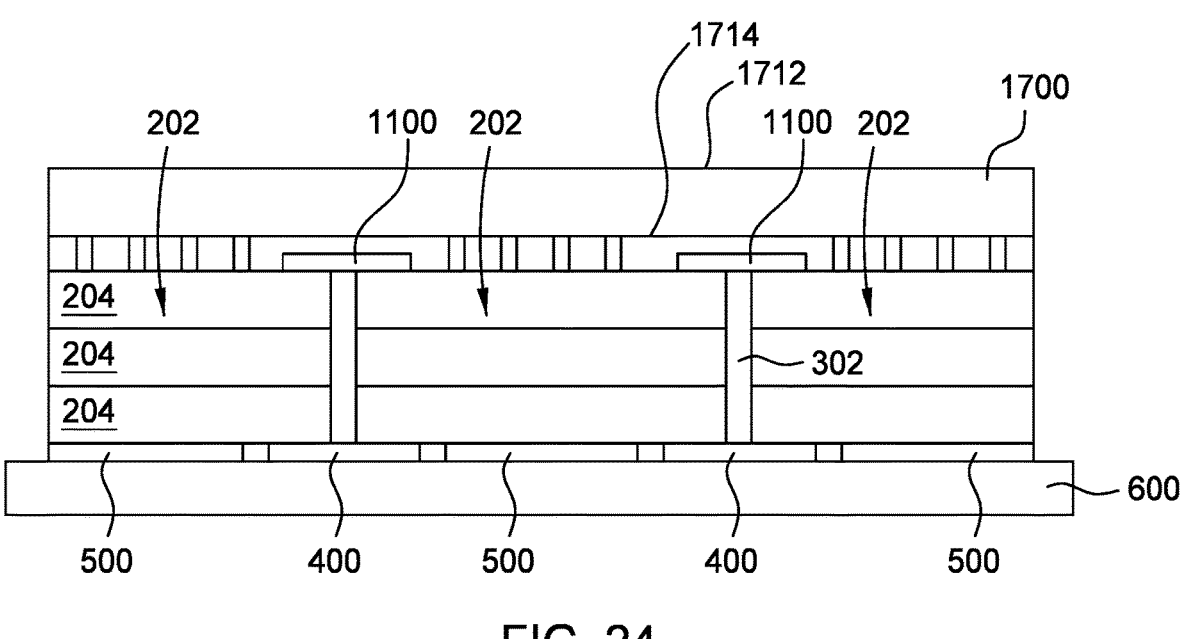

After formation of the dielectric layer 2302 and the pillars 2304, the dielectric layer 2302 and the pillars 2304 are planarized to allow an interconnect routing structure to be formed thereon at operation 2014, as shown in FIG. 24. In FIG. 24, the interconnect routing structure is embodied as a redistribution layer 1700 The dielectric layer 2302 and the pillars 2304 may be planarized by chemical mechanical polishing, etching, grinding or other suitable technique.

Figure 25:
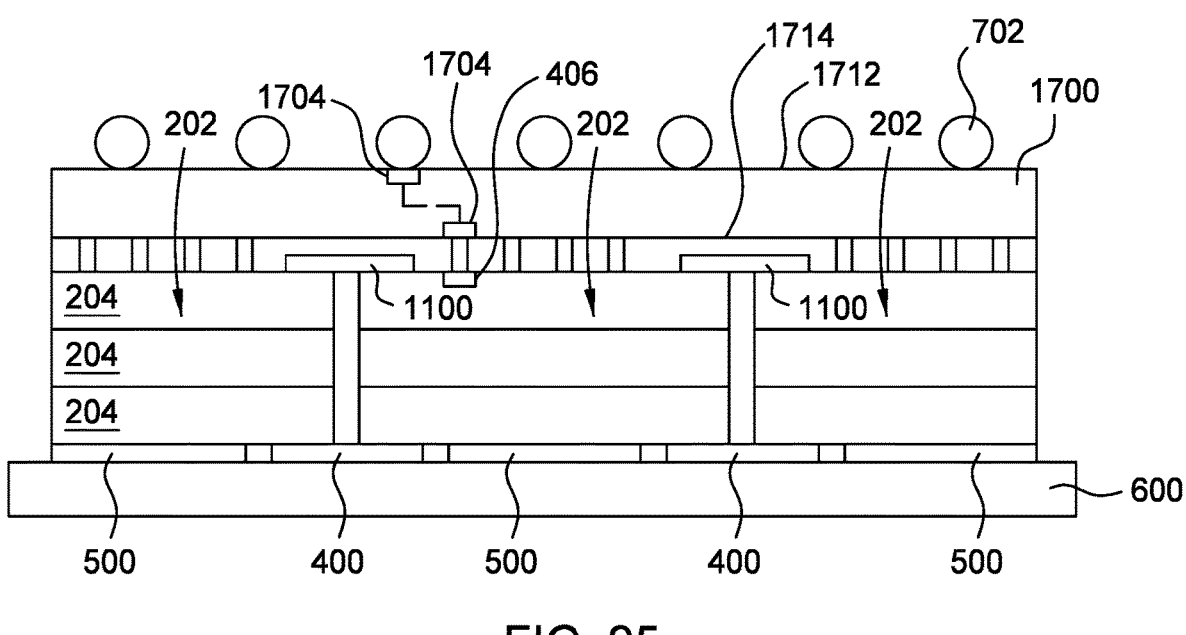
Figures 26, 27:
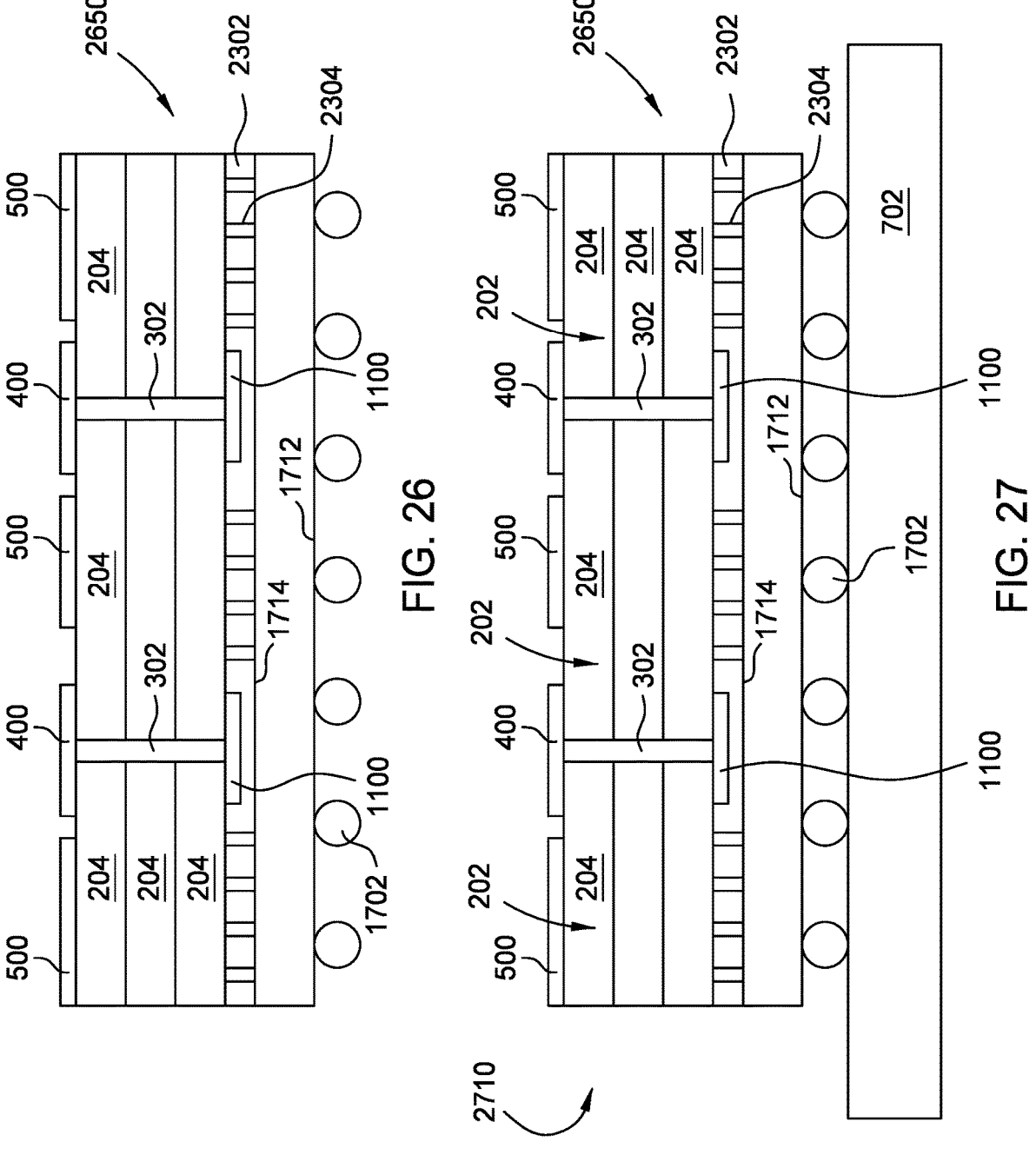

At operation 2016, solder connections 1702 are plated or otherwise formed on the pads 1704 of the redistribution layer 1700 after the redistribution layer 1700 is formed on the IC dies 204, as illustrated in FIG. 25.

At operation 2018, the second temporary carrier 600 is removed from the bridge connected die stack assembly 2650, as illustrated in FIG. 26. At operation 2020, the bridge connected die stack assembly 2650 is then electrically and physically connected to a substrate 702, such as an interposer or package substrate, to form the chip package 2710 as shown in FIG. 27. The bridge connected die stack assembly 2650 may be electrically and physically connected to the substrate 702 via hybrid bonding, solder connection, or suitable technique.

Although not shown in FIG. 26, solder balls may be used to connect the chip package 2710 to a printed circuit board (PCB) to form an electronic device, such as described above and shown in FIG. 14. In other embodiments, the substrate 702 may be in the form of an interposer, and rather than a PCB 912, the interposer substrate 702 is coupled by the solder balls to a package substrate to form the chip package 2710.

Thus, a chip package and method for fabricating the same have been described that includes a hybrid bonded bridge die. The hybrid bonded bridge die enables fine pitch and high density interconnects between IC dies on adjacent die stacks without being routed through an interconnect routing structure, such as an interposer, package substrate or redistribution layer. The hybrid bonded high density interconnects enables more than 10 times the amount of connections per unit area as compared to microbump interfaces, and thus can significantly reduce the super logic region to super logic region connectivity bottlenecks in conventional 3D stacked devices. The hybrid bonded bridge die allows more metal traces per unit area, allows shorter distances between connections, and thinner metal routings, all of which enable a significant increase in connection density. As an end result, the chip package with hybrid bonded interfaces provide increased bandwidth, reliability and performance over conventional solder interface designs.

While the foregoing is directed to embodiments of the present invention, other and further embodiments of the invention may be devised without departing from the basic scope thereof, and the scope thereof is determined by the claims that follow.

What is claimed is:

1. A chip package comprising:
an interconnect routing structure;
a first die stack comprising a top die disposed over a bottom die, the bottom die of the first die stack stacked on a first surface of the interconnect routing structure;
a second die stack comprising a top die disposed over a bottom die, the bottom die of the second die stack stacked on the first surface of the interconnect routing structure; and
a first bridge die hybrid bonded to the top dies of the first and second die stacks, the first bridge die having solid state circuitry that connects circuitries of the top dies of the first and second die stacks, wherein the first bridge die has a connection density with the top die of the first die stack that is greater than a connection density between the bottom die of the first die stack and the interconnect routing structure.

2. The chip package of claim 1 further comprising:
a third die stack comprising a top die disposed over a bottom die, the bottom die of the third die stack stacked on the first surface of the interconnect routing structure; and
a second bridge die electrically and mechanically coupled to the top dies of the second and third die stacks, the second bridge die having solid state circuitry that connects circuitries of the top dies of the second and third die stacks.

3. The chip package of claim 2 further comprising:
a spacer mounted to the top die of the second die stack, the spacer disposed between the first and second bridge dies.

4. The chip package of claim 3, wherein the spacer is a memory die, a processor die, a dummy die or a deep trench capacitor.

5. The chip package of claim 4, wherein the spacer further comprises circuitry that is electrically coupled to circuitry of the top die of the second die stack.

6. The chip package of claim 1 further comprising:
a first memory stack electrically and mechanically coupled to the first surface of the interconnect routing structure; and
a second memory stack electrically and mechanically coupled to the first surface of the interconnect routing structure, wherein the first and second die stacks include logic dies that are disposed between the first and second memory stacks, the first and second memory stacks in electrical communication with the logic dies of the first and second die stacks through the interconnect routing structure.

7. The chip package of claim 1, wherein the first and second die stacks in electrical communication through the interconnect routing structure and the first bridge die.

8. The chip package of claim 1 further comprising:
a second bridge die electrically and mechanically coupled to the bottom dies of the first and second die stacks, the second bridge die having solid state circuitry that connects circuitries of the bottom dies of the first and second die stacks.

9. The chip package of claim 1, wherein the interconnect routing structure is a package substrate.

10. The chip package of claim 1, wherein the interconnect routing structure is a redistribution layer formed on the bottom dies of the first and second die stacks.

11. A chip package comprising:
an interconnect routing structure having a bottom surface configured to receive a solder connection and a top surface, the interconnect routing structure one of a redistribution layer or a package substrate;
a first die stack comprising a top die disposed over a bottom die, the bottom die of the first die stack disposed directly on the top surface of the interconnect routing structure, circuitry of the bottom die coupled to circuitry of the interconnect routing structure at a first connection density;
a second die stack comprising a top die disposed over a bottom die, the bottom die of the second die stack stacked on the top surface of the interconnect routing structure; and
a first bridge die electrically and mechanically coupled to the top dies of the first and second die stacks, the first bridge die having solid state circuitry that connects circuitries of the top dies of the first and second die stacks at a second connection density that is greater than the first connection density.

12. The chip package of claim 11 further comprising:
a third die stack comprising a top die disposed over a bottom die, the bottom die of the third die stack stacked on the top surface of the interconnect routing structure; and
a second bridge die electrically and mechanically coupled to the top dies of the second and third die stacks, the second bridge die having solid state circuitry that connects circuitries of the top dies of the second and third die stacks.

13. The chip package of claim 12 further comprising:
a spacer mounted to the top die of the second die stack, the spacer disposed between the first and second bridge dies, wherein the spacer is a memory die or a deep trench capacitor, the spacer comprising circuitry that is electrically coupled to the circuitry of the top die of the second die stack.

14. The chip package of claim 11 further comprising:

a first memory stack electrically and mechanically coupled to the interconnect routing structure; and a second memory stack electrically and mechanically coupled to the top surface of the interconnect routing structure, wherein the first and second die stacks include logic dies that are disposed between the first and second memory stacks, the first and second memory stacks in electrical communication with the logic dies of the first and second die stacks through the interconnect routing structure.

15. The chip package of claim 11, wherein the first bridge die is hybrid bonded to the top dies of the first and second die stacks.

16. The chip package of claim 11 further comprising:

a second bridge die electrically and mechanically coupled to the bottom dies of the first and second die stacks, the second bridge die having solid state circuitry that connects circuitries of the bottom dies of the first and second die stacks.

17. A chip package comprising:

an interconnect routing structure;

a first die stack comprising a top die disposed over a bottom die, the bottom die of the first die stack stacked on a first surface of the interconnect routing structure;

a second die stack comprising a top die disposed over a bottom die, the bottom die of the second die stack stacked on the first surface of the interconnect routing structure;

a first bridge die hybrid bonded to the top dies of the first and second die stacks, the first bridge die having solid state circuitry that connects circuitries of the top dies of the first and second die stacks;

a first memory stack electrically and mechanically coupled to the first surface of the interconnect routing structure; and a second memory stack electrically and mechanically coupled to the first surface of the interconnect routing structure, wherein the first and second die stacks include logic dies that are disposed between the first and second memory stacks, the first and second memory stacks in electrical communication with the logic dies of the first and second die stacks through the interconnect routing structure.

18. The chip package of claim 17 further comprising:

a third die stack comprising a top die disposed over a bottom die, the bottom die of the third die stack stacked on the first surface of the interconnect routing structure; and a second bridge die electrically and mechanically coupled to the top dies of the second and third die stacks, the second bridge die having solid state circuitry that connects circuitries of the top dies of the second and third die stacks.

19. The chip package of claim 18 further comprising:

a spacer mounted to the top die of the second die stack, the spacer disposed between the first and second bridge dies.

20. The chip package of claim 19, wherein the spacer is a memory die, a processor die, a dummy die or a deep trench capacitor.

21. The chip package of claim 20, wherein the spacer further comprises circuitry that is electrically coupled to circuitry of the top die of the second die stack.

22. The chip package of claim 17, wherein the first and second die stacks in electrical communication through the interconnect routing structure and the first bridge die.

23. The chip package of claim 17 further comprising:

a second bridge die electrically and mechanically coupled to the bottom dies of the first and second die stacks, the second bridge die having solid state circuitry that connects circuitries of the bottom dies of the first and second die stacks.

24. The chip package of claim 17, wherein the interconnect routing structure is a package substrate.

25. The chip package of claim 17, wherein the interconnect routing structure is a redistribution layer formed on the bottom dies of the first and second die stacks.

26. A chip package comprising:

an interconnect routing structure;

a first die stack comprising a top die disposed over a bottom die, the bottom die of the first die stack stacked on a first surface of the interconnect routing structure;

a second die stack comprising a top die disposed over a bottom die, the bottom die of the second die stack stacked on the first surface of the interconnect routing structure;

a first bridge die hybrid bonded to the top dies of the first and second die stacks, the first bridge die having solid state circuitry that connects circuitries of the top dies of the first and second die stacks;

a third die stack comprising a top die disposed over a bottom die, the bottom die of the third die stack stacked on the first surface of the interconnect routing structure;

a second bridge die electrically and mechanically coupled to the top dies of the second and third die stacks, the second bridge die having solid state circuitry that connects circuitries of the top dies of the second and third die stacks; and a spacer mounted to the top die of the second die stack, the spacer disposed between the first and second bridge dies.

27. The chip package of claim 26, wherein the spacer is a memory die, a processor die, a dummy die or a deep trench capacitor.

28. The chip package of claim 27, wherein the spacer further comprises circuitry that is electrically coupled to circuitry of the top die of the second die stack.

* * * * *